United States Patent
Nozu

(10) Patent No.: US 7,215,013 B2
(45) Date of Patent: May 8, 2007

(54) SEMICONDUCTOR DEVICE AND SEMICONDUCTOR APPARATUS

(75) Inventor: Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 10/975,385

(22) Filed: Oct. 29, 2004

(65) Prior Publication Data

US 2005/0275114 A1 Dec. 15, 2005

(30) Foreign Application Priority Data

Jun. 9, 2004 (JP) ............................. 2004-171215

(51) Int. Cl.
*H01L 23/498* (2006.01)

(52) U.S. Cl. ................. 257/676; 257/678; 257/772

(58) Field of Classification Search ................ 257/782, 257/779, 678, 772, 676
See application file for complete search history.

(56) References Cited

U.S. PATENT DOCUMENTS

| | | | |
|---|---|---|---|
| 6,362,528 B2 * | 3/2002 | Anand ......................... 257/758 |
| 6,406,636 B1 * | 6/2002 | Vaganov ........................ 216/2 |
| 2002/0030285 A1 * | 3/2002 | Sawada et al. .............. 257/782 |
| 2006/0008947 A1 * | 1/2006 | Yamaguchi .................. 438/114 |
| 2006/0022349 A1 * | 2/2006 | Shimazaki et al. .......... 257/762 |
| 2006/0102976 A1 * | 5/2006 | Kruhler ....................... 257/448 |

FOREIGN PATENT DOCUMENTS

| | | |
|---|---|---|
| JP | 6-177178 | 6/1994 |
| JP | 10-512402 | 11/1998 |
| JP | 2003-500858 | 1/2003 |

OTHER PUBLICATIONS

T. Brunschwiler, et al., "Hierarchically Nested Channels for Fast Squeezing Interfaces with Reduced Thermal Resistance" Proceedings 2005, Semiconductor Thermal Measurement and Management Symposium, San Jose, CA, USA Mar. 15-17, 2005, pp. 31-38 w/cover sheet.

* cited by examiner

*Primary Examiner*—Douglas W. Owens
(74) *Attorney, Agent, or Firm*—Oblon, Spivak, McClelland, Maier & Neustadt, P.C.

(57) ABSTRACT

A semiconductor device comprises a bonding surface to be mounted with adhesive or solder on a mounting surface of a mounting member. One or more grooves are provided on the bonding surface that extend in a direction substantially parallel to one side surface of the semiconductor device.

15 Claims, 20 Drawing Sheets

SEMICONDUCTOR DEVICE AND SEMICONDUCTOR APPARATUS

CROSS-REFERENCE TO RELATED APPLICATIONS

This application is based upon and claims the benefit of priority from the prior Japanese Patent Application No. 2004-171215, filed on Jun. 19, 2004; the entire contents of which are incorporated herein by reference.

BACKGROUND OF THE INVENTION

The invention relates to a semiconductor device and a semiconductor apparatus. In particular, the invention relates to a semiconductor device mounted on a mounting member with adhesive or solder, and a semiconductor apparatus equipped with such a semiconductor device.

Semiconductor devices often require compatibility between miniaturization and heat dissipation. For example, in recent years, it is important in the field of mobile communication including cellular phones to enhance the performance of high-frequency semiconductor power devices used in the transmitting unit. More specifically, these semiconductor power devices require not only a good high-frequency performance, but also a good heat dissipation because a device of only several millimeters square has power consumption up to several watts. In other words, the heat resistance of the semiconductor device must also be reduced.

Semiconductor devices are mounted on, for example, a circuit board. The mounting area of a semiconductor device is determined by a method of bonding the semiconductor device onto the board. There are various methods of bonding the semiconductor device onto the board. Typical methods include those using solder, silver paste or epoxy-based adhesives.

FIG. 23 is a schematic view showing a cross-sectional structure of a semiconductor apparatus that the inventor investigated in the process of reaching the invention. The semiconductor apparatus 200 has a mounting board 107 and a semiconductor device 100 mounted thereon. The semiconductor device 100 has a GaAs substrate 102, a HBT (heterojunction bipolar transistor) device section 104 formed on the GaAs substrate 102, a polyimide insulating protection film 103 for protecting the HBT device section 104, and bonding gold (Au) pads 105 formed on the GaAs substrate 102. The HBT device section 104 is formed by epitaxial growth on the GaAs substrate 102. When the semiconductor device 100 is mounted on the mounting board 107, a certain amount of adhesive or solder 109 is first applied to the surface of the mounting board 107. The semiconductor device 100 is then placed on the adhesive 109, and bonded to the mounting board 107 by pressure from above or by descending of its own weight. Subsequently, the bonding pad 105 on the semiconductor device 100 is electrically connected with a bonding Au pad 108 on the mounting board 107 via a bonding wire 110.

In a structure of soldering a semiconductor device onto aboard as described above, it is also proposed that a peripheral portion of the bottom surface of the semiconductor device is notched to provide a connection strengthening space for thickening the solder layer (Japanese Laid-Open Patent Application (Kokai) H06-177178).

However, these semiconductor apparatuses have a problem that an excess of adhesive 109 is pushed out around the semiconductor device 100 when the semiconductor device 100 is mounted on the mounting board 107.

More specifically, when the semiconductor device 100 is placed on the adhesive 109 and bonded to the mounting board 107 as described above, an excess of adhesive (solder) 109 is discharged around the semiconductor device 100. This process can improve adhesion between the semiconductor device 100 and the mounting board 107 and reduce the film thickness of the adhesive (solder) 109 under the semiconductor device 100. As a result, the heat resistance of the semiconductor apparatus can be decreased.

However, the excess adhesive 109 discharged around the semiconductor device 100 extends from the side surface of the semiconductor device 100 to its periphery. The inventor's investigation has found that the associated distance D2 may exceed 0.4 mm. Because of this "squeezeout" of adhesive 109, the distance between the semiconductor device 100 and the bonding pad 180 of the mounting board 107 is forced to be increased, which inevitably also lengthens the bonding wire 110. The lengthening of the bonding wire 110 increases its parasite inductance, which degrades the high-frequency characteristics of the semiconductor apparatus. This is undesirable for adapting the semiconductor apparatus to high frequencies. In addition, the squeeze out of adhesive 109 also increases the overall area of the mounting board for the semiconductor device, which is also undesirable for miniaturization of the semiconductor apparatus. In other words, there is a need for decreasing the area of adhesive squeezeout around the semiconductor device.

Similar problems also occur in the semiconductor device disclosed in Patent Document 1. More specifically, even if a peripheral portion of the bottom surface of the semiconductor device is notched, the inside wide region of the bottom surface is flat. The solder applied to the region is thus discharged to the periphery to cause "squeezeout".

SUMMARY OF THE INVENTION

According to an aspect of the invention, there is provided a semiconductor device comprising a bonding surface to be mounted with adhesive or solder on a mounting surface of a mounting member, one or more grooves being provided on the bonding surface, the grooves extending in a direction substantially parallel to one side surface of the semiconductor device.

According to another aspect of the invention, there is provided a semiconductor apparatus comprising a mounting member having a mounting surface and a semiconductor device mounted with adhesive or solder on the mounting surface, one or more grooves being provided on a bonding surface of the semiconductor device, the grooves extending in a direction substantially parallel to one side surface of the semiconductor device.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings.

DETAILED DESCRIPTION

An embodiment of the invention will now be described with reference to the drawings.

Figure 1:
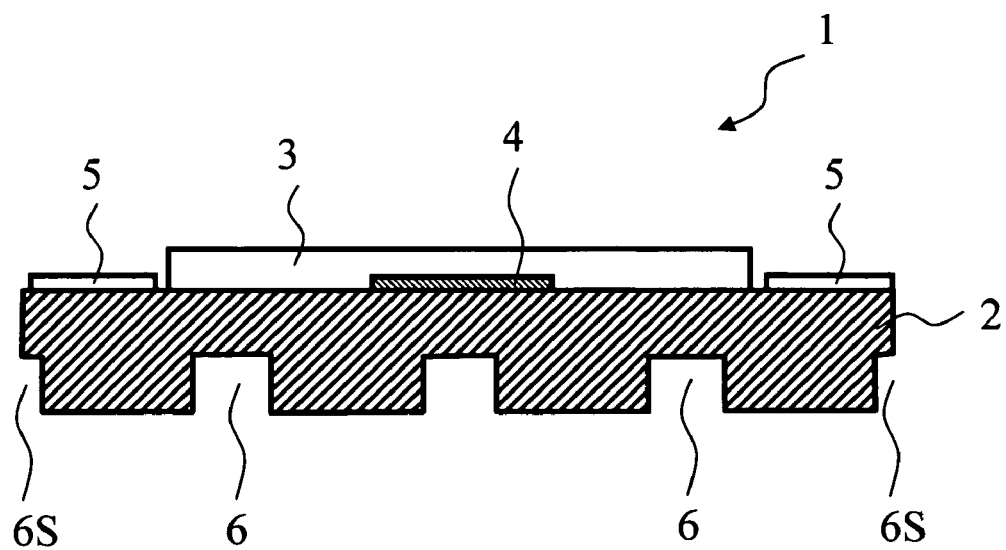
FIG. 1 is a schematic view illustrating a cross-sectional structure of a semiconductor device according to an embodiment of the invention.

FIG. 1 is a schematic view illustrating a cross-sectional structure of a semiconductor device according to an embodiment of the invention. The semiconductor device 1 according to the present embodiment has a GaAs substrate 2, a HBT (heterojunction bipolar transistor) device section 4 formed on the GaAs substrate 2, a polyimide insulating protection film 3 provided to cover the HBT device section 4, and two bonding Au pads 5 formed on the GaAs substrate 2. The HBT device section 4 is formed by epitaxial growth on the GaAs substrate 2. The underside of the GaAs substrate 2 is provided with a plurality of grooves 6 (6S) in, for example, a grid-like arrangement. As described later in detail, provision of these grooves 6 can suppress the squeezeout of adhesive for fixing the underside of the semiconductor device 1.

Figure 2:
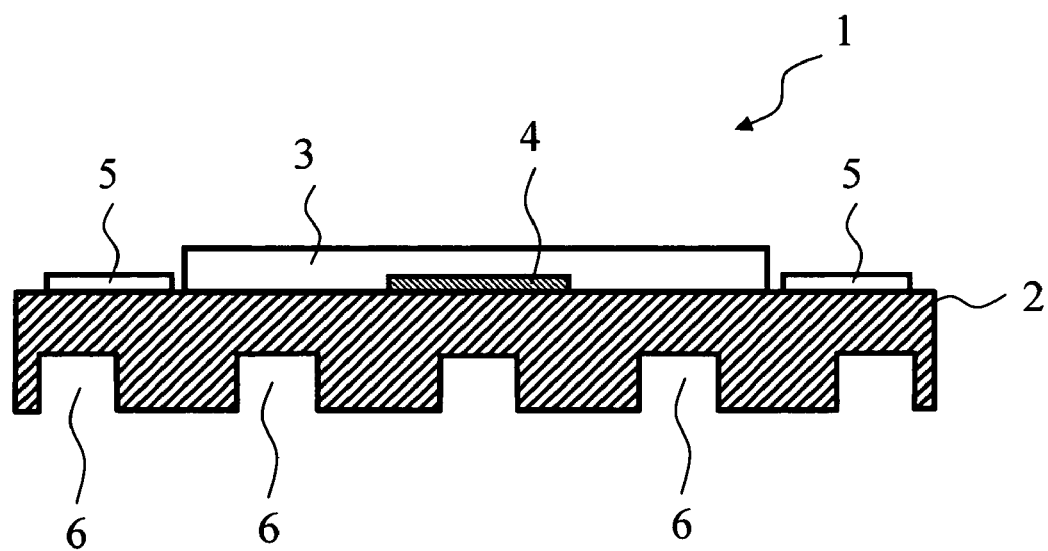
FIG. 2 is a schematic cross-sectional view showing another specific example of the semiconductor device according to the embodiment of the invention.

FIG. 2 is a schematic cross-sectional view showing another specific example of the semiconductor device according to the present embodiment. Also in this specific example, the underside of the substrate 2 is provided with a plurality of grooves 6 in, for example, a grid-like arrangement.

Figure 3:
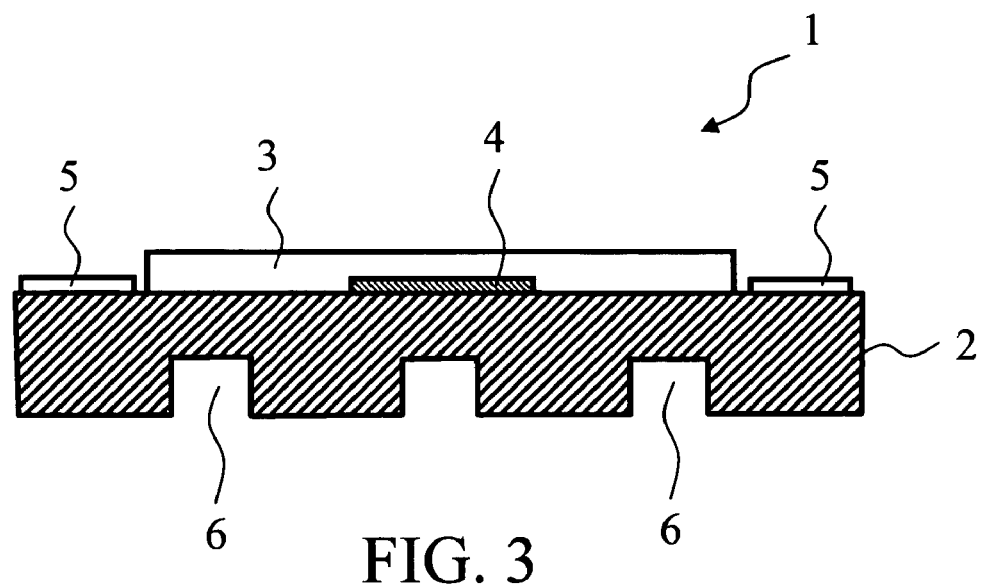
FIG. 3 is a schematic cross-sectional view showing still another specific example of the semiconductor device according to the embodiment of the invention.

FIG. 3 is a schematic cross-sectional view showing still another specific example of the semiconductor device according to the present embodiment. Also in this specific example, the underside of the substrate 2 is provided with a plurality of grooves 6 in, for example, a grid-like arrangement.

The semiconductor device shown in FIG. 1 is different from the semiconductor devices shown in FIGS. 2 and 3 in the edge of the device. More specifically, the semiconductor device shown in FIG. 1 has grooves 6S also at the edge of the device. On the contrary, the semiconductor device shown in FIGS. 2 and 3 has no grooves at the edge of the device.

Further, the semiconductor device shown in FIG. 2 is different from the semiconductor device shown in FIG. 3 in the pitch between the grooves 6. This will be described later in detail.

Figure 4:
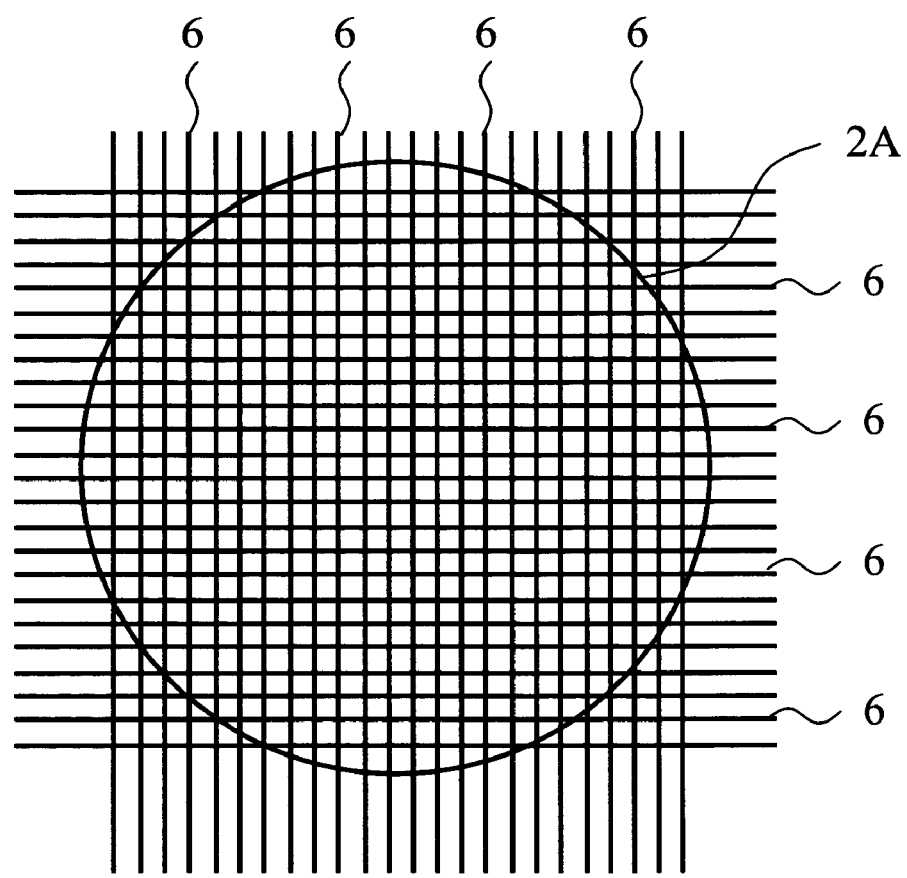
FIGS. 4–6 are schematic views illustrating steps of providing grooves 6 (6S) on the underside of the semiconductor device according to the embodiment of the invention.
Figure 5:
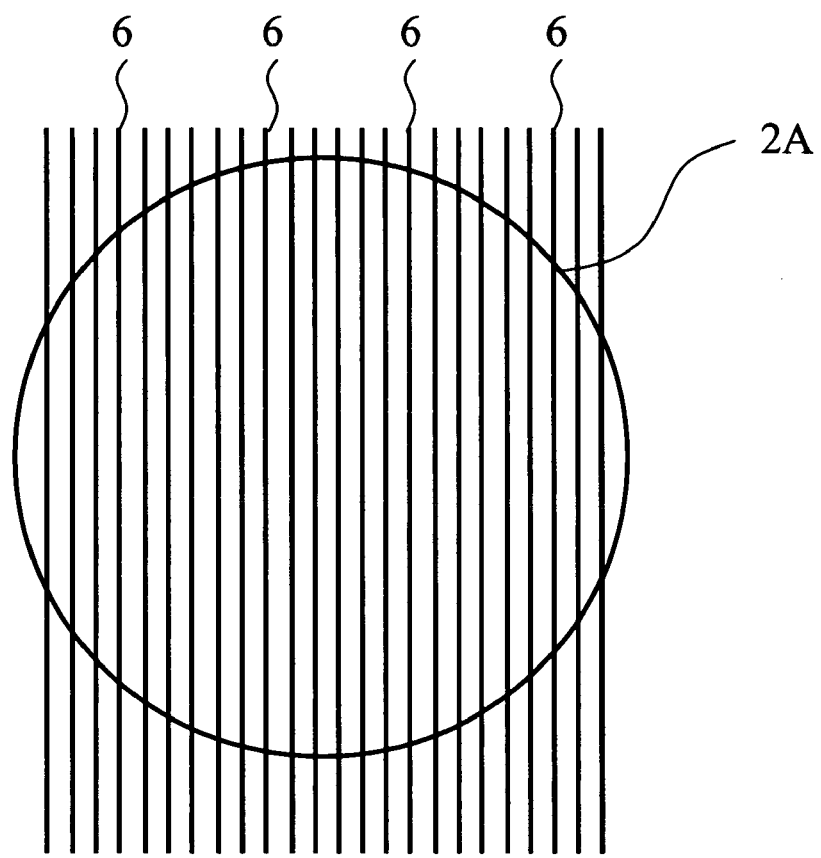
Figure 6:
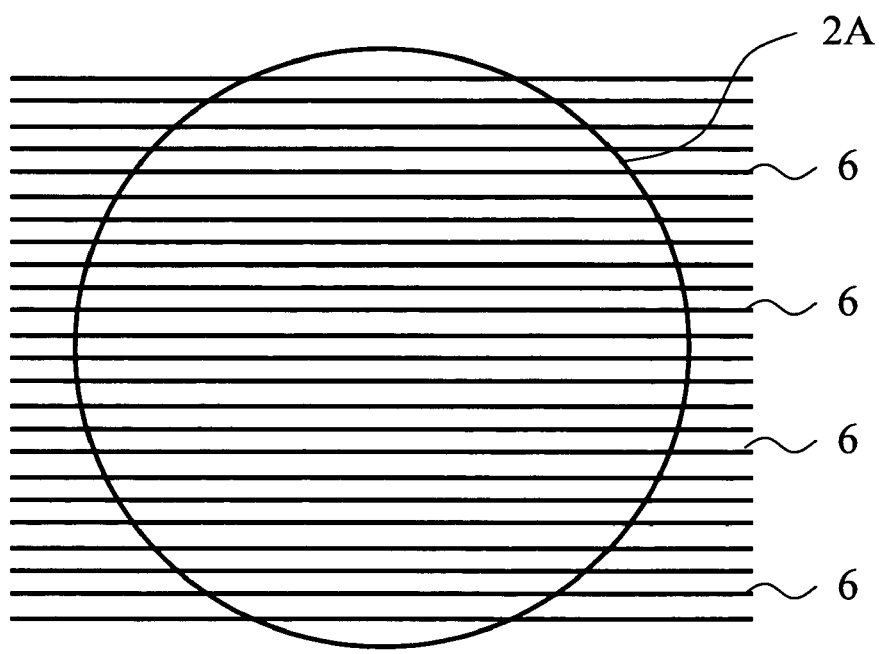

FIGS. 4–6 are schematic views illustrating steps of providing grooves 6 (6S) on the underside of the semiconductor device according to the present embodiment.

More specifically, according to the invention, a plurality of grooves 6 (6S) can be formed using, for example, a dicing saw, on the underside of a wafer 2A where a plurality of semiconductor devices 1 are to be formed. As shown in FIG. 4, the plurality of grooves 6 (6S) can be formed on the underside of the wafer 2A horizontally and vertically in a grid-like arrangement. However, the invention does not require that the grooves 6 be provided in a grid-like arrangement. For example, a plurality of grooves 6 may be formed vertically as shown in FIG. 5, or horizontally as shown in FIG. 6. In either of these cases, it is desirable that adjacent grooves 6 are provided in parallel to each other.

Figure 7:
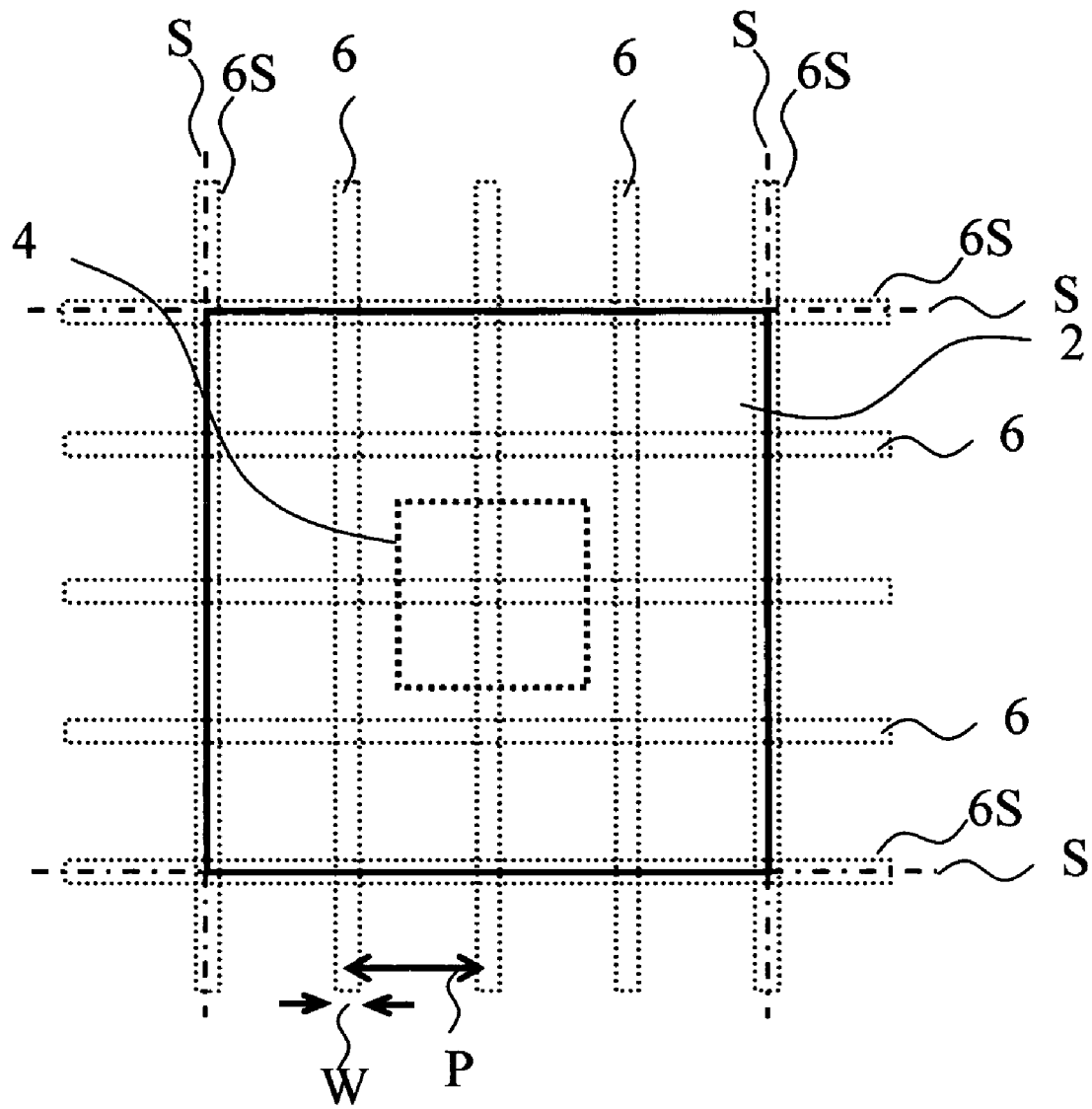
FIG. 7 is an enlarged schematic view of a planar structure on the underside of a GaAs substrate in the process of manufacturing the semiconductor device illustrated in FIG. 1.

FIG. 7 is an enlarged schematic view of a planar structure on the underside of a GaAs substrate in the process of manufacturing the semiconductor device illustrated in FIG. 1. In this specific example, a plurality of grooves 6 are formed on the underside of the wafer 2A horizontally and vertically in a grid-like arrangement. These grid-like grooves 6 are formed in parallel to the side surface of the GaAs substrate 2 or the HBT device section 4.

Grooves 6S are also formed at the boundary between adjacent semiconductor devices. More specifically, the boundary between adjacent semiconductor devices is located at the center of the groove 6S. A scribe line S for separating the semiconductor device 1 is formed at the center of the groove 6S. The grooves 6, 6S are formed from the underside of the substrate 2 halfway through its thickness, whereas the scribe lines S are provided completely through the substrate 2 for separating the semiconductor device 1. In this situation, the scribe line S with a width narrower than that of the groove 6S can avoid "chipping"

that may otherwise occur at the opening edge of the groove 6S when the scribe line S is formed.

In this specific example, for instance, both the grooves 6 and 6S can have a width W of 100 μm and a depth of 75 μm, and the distance (pitch) P between the centers of adjacent grooves 6, 6S can be set to 275 μm. In addition, the scribe line S can have a width of 50 μm.

Alternatively, the groove 6 may have a width W of 50 μm, and the groove 6S may have a width L of 100 μm.

Figure 8:
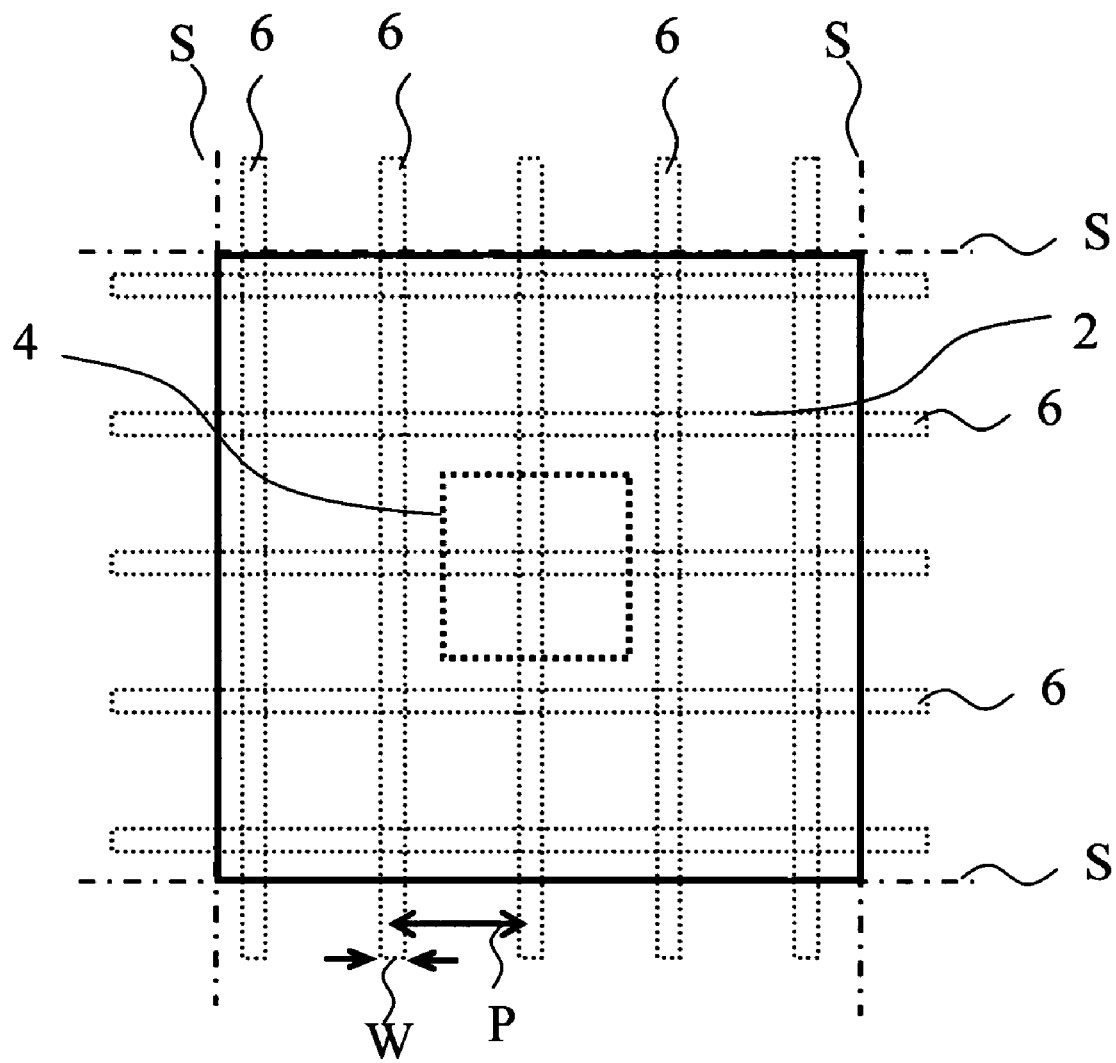
FIG. 8 is an enlarged schematic view of a planar structure on the underside of a GaAs substrate in the process of manufacturing the semiconductor device illustrated in FIG. 2.

FIG. 8 is an enlarged schematic view of a planar structure on the underside of a GaAs substrate in the process of manufacturing the semiconductor device illustrated in FIG. 2. Also in this specific example, a plurality of grooves 6 are formed on the underside of the wafer 2A horizontally and vertically in a grid-like arrangement. However, these grooves 6 are provided so that they do not agree with the boundary of the semiconductor device 1. Scribe lines S are separately provided at the boundary of the semiconductor device 1. More specifically, after the grooves 6 are formed, the scribe lines S are formed at the boundary of the semiconductor device 1 where the grooves 6 are not formed to separate the semiconductor device 1. This can avoid "chipping" that may otherwise occur at the edge of the previously formed groove 6, when the scribe line S is formed.

In this specific example, the width of the groove 6 may be equal to, or narrower or wider than the width of the scribe line S. For example, the groove 6 can have a width W of 50 μm and a depth of 75 μm, and the distance (pitch) P between the centers of adjacent grooves 6 can be set to 175 μm.

Figure 9:
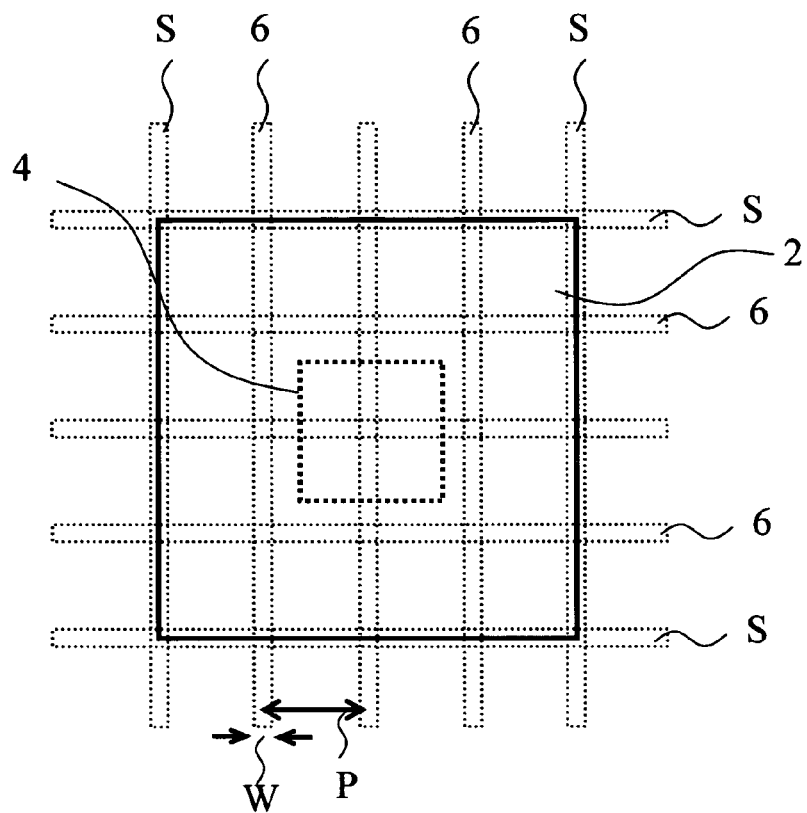
FIG. 9 is an enlarged schematic view of a planar structure on the underside of a GaAs substrate in the process of manufacturing the semiconductor device illustrated in FIG. 3.

FIG. 9 is an enlarged schematic view of a planar structure on the underside of a GaAs substrate in the process of manufacturing the semiconductor device illustrated in FIG. 3. Also in this specific example, a plurality of grooves 6 are formed on the underside of the wafer 2A horizontally and vertically in a grid-like arrangement. However, these grooves 6 are provided so that they agree with the boundary of the semiconductor device 1. In other words, a side of the semiconductor device 1 has a size that is an integral multiple of the pitch P of the arrangement of the grooves 6. Some of the grooves 6 that are formed on the boundary of the semiconductor device 1 act as scribe lines. More specifically, some of the grooves 6 that are formed on the boundary of the semiconductor device 1 can be caused to penetrate to the other side to separate the semiconductor device 1. This can also avoid "chipping" due to the scribe line overlapping the previously formed groove 6.

Figure 10:
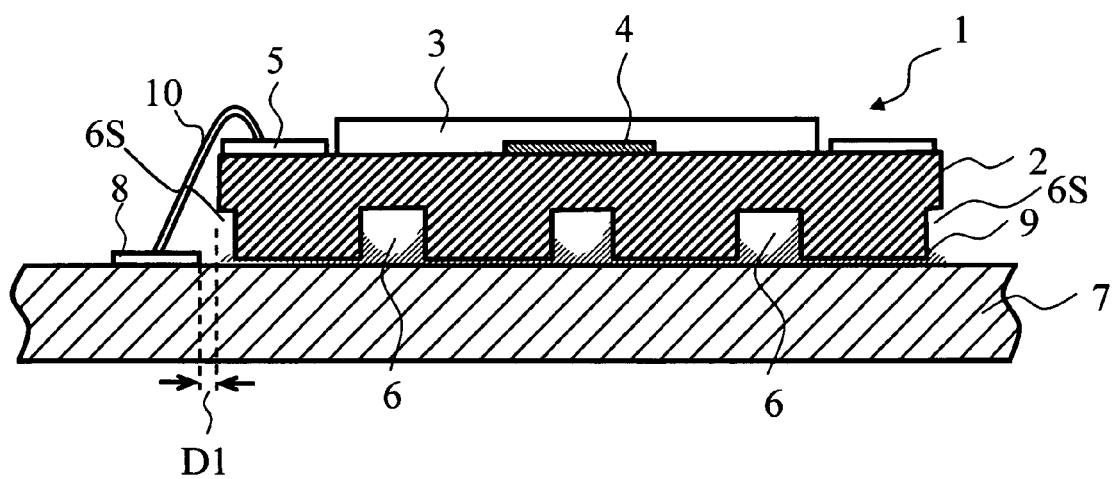
FIGS. 10–12 are schematic views illustrating a cross-sectional structure of a semiconductor apparatus according to the embodiment of the invention.
Figure 11:
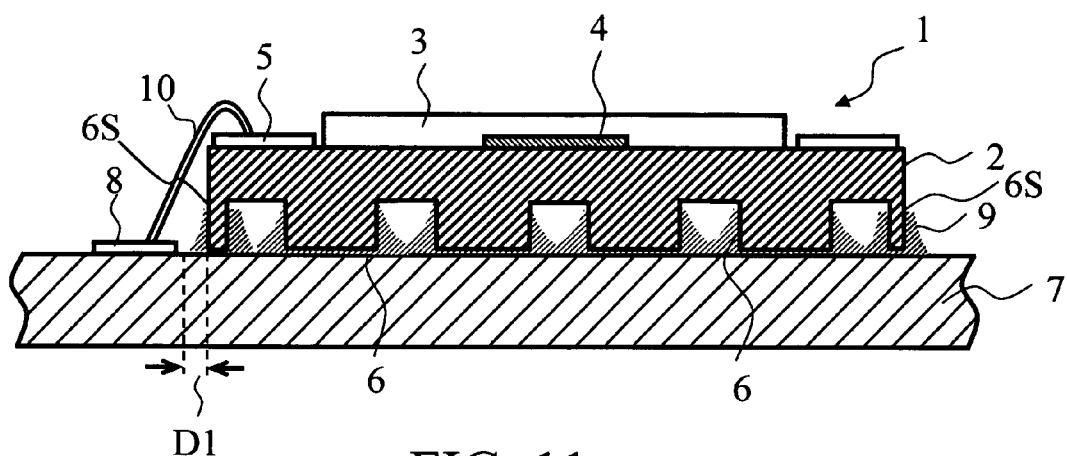
Figure 12:
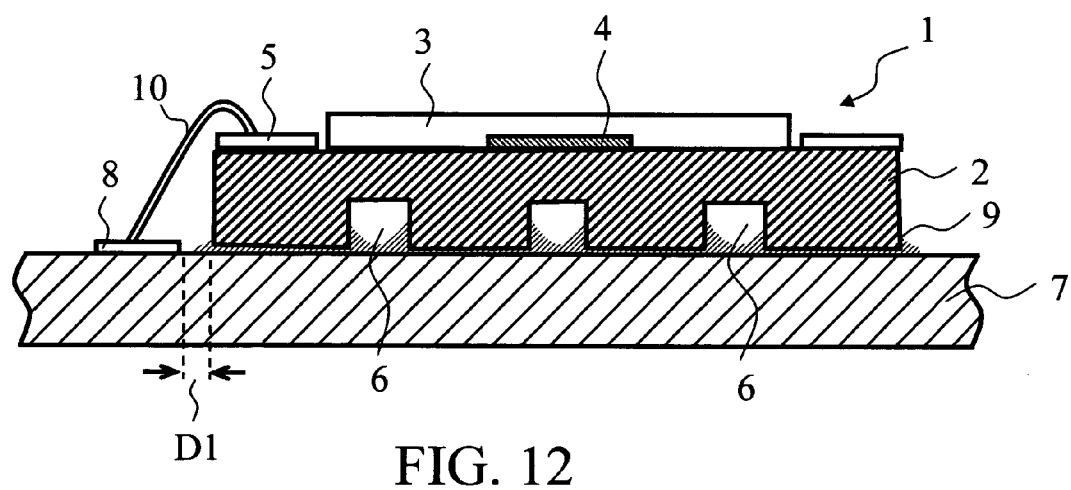

FIGS. 10–12 are schematic views illustrating a cross-sectional structure of a semiconductor apparatus according to the embodiment of the invention. More specifically, in the semiconductor apparatus shown in FIG. 10, the semiconductor device 1 illustrated in FIG. 1 is mounted on a mounting board 7 with adhesive or solder 9, and electrically connected thereto via a bonding Au pad 5 through a bonding wire 10. The semiconductor apparatus shown in FIG. 11 is equipped with the semiconductor device 1 illustrated in FIG. 2. Similarly, semiconductor apparatus shown in FIG. 12 is equipped with the semiconductor device 1 illustrated in FIG. 3.

As seen from FIGS. 10–12, excess adhesive 9 is incorporated into the grid-like grooves 6 formed on the underside of the GaAs substrate 2. In other words, the grooves 6 absorb the excess adhesive 9. Therefore, the amount of squeezeout of adhesive 9 to the periphery of the semiconductor device 1 is decreased. That is, the mounting area of the semiconductor device 1 can be reduced.

Figure 23:
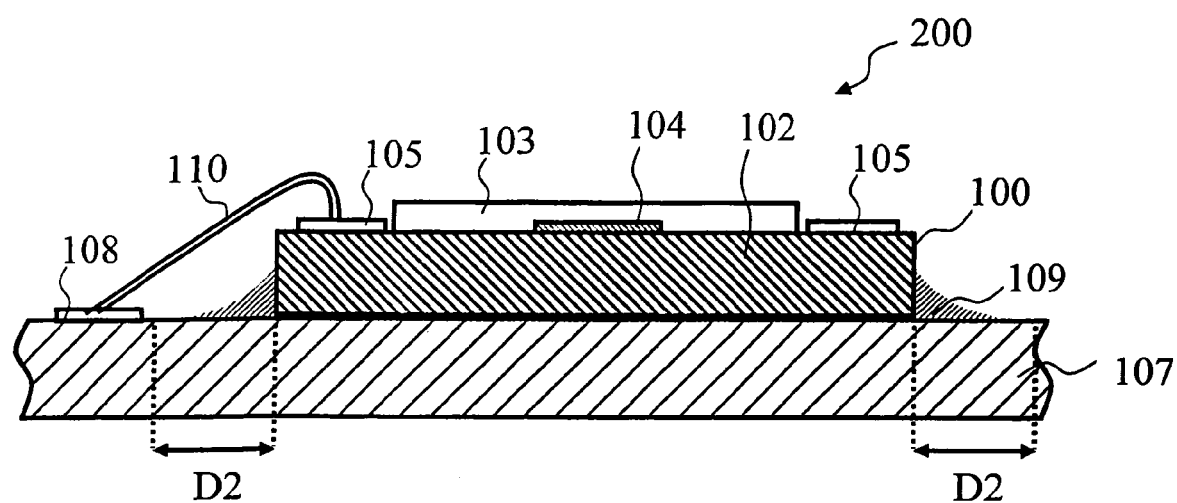
FIG. 23 is a schematic view showing a cross-sectional structure of a semiconductor apparatus that the inventor investigated in the process of reaching the invention.

Suppression of the squeezeout of adhesive 9 enables the bonding pad 8 to be provided closer to the semiconductor device 1. The distance D1 between the bonding pad 8 and the semiconductor device 1 in the semiconductor apparatus of the present embodiment is much smaller than the distance D2 between the bonding pad 108 and the semiconductor device 100 in the semiconductor apparatus described above with reference to FIG. 23. The size of the semiconductor apparatus can thus be reduced. This also leads to a shorter length of the bonding wire 10, which improves high-frequency characteristics of the semiconductor device.

In addition, in the semiconductor apparatus shown in FIG. 10, provision of grooves 6S at the edge of the semiconductor device 1 can further suppress the amount of squeezeout of adhesive 9 to the outside of the device 1, and further reduce the distance D1 between the bonding pad 8 and the semiconductor device 1.

Next, a method of manufacturing a semiconductor device according to the embodiment of the invention will be described.

FIGS. 13A through 13D are process cross-sectional views showing a method of manufacturing the semiconductor device shown in FIGS. 1 and 10.

Figure 13A:
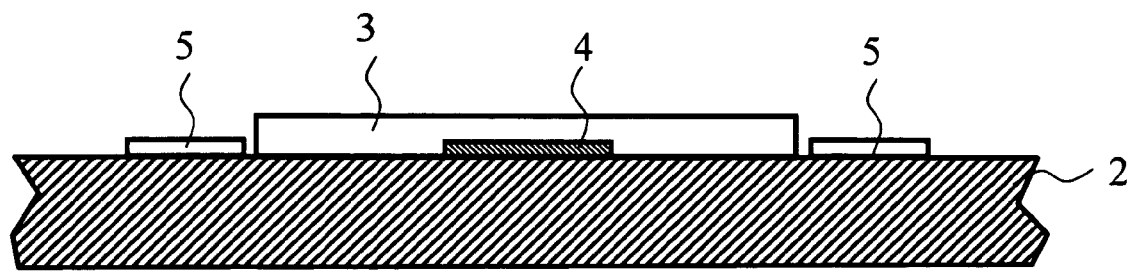
FIGS. 13A through 13D are process cross-sectional views showing a method of manufacturing the semiconductor device shown in FIGS. 1 and 10.

First, as shown in FIG. 13A, a HBT device section 4 and bonding Au pads 5 are formed on a GaAs substrate 2 (its film thickness being 650 μm). A polyimide insulating protection film 3 is formed to cover the HBT device section 4. The HBT device section 4 has a square shape of 400 μm per side, for example, and is formed on the GaAs substrate 2 by epitaxial growth. The semiconductor device 1 can have a square shape of 1 mm per side, for example. In order to reduce the heat resistivity from the HBT device 4 to the underside of the substrate 2, the underside of the GaAs substrate 2 is polished to a thickness of 150 μm by lapping.

Figure 13B:
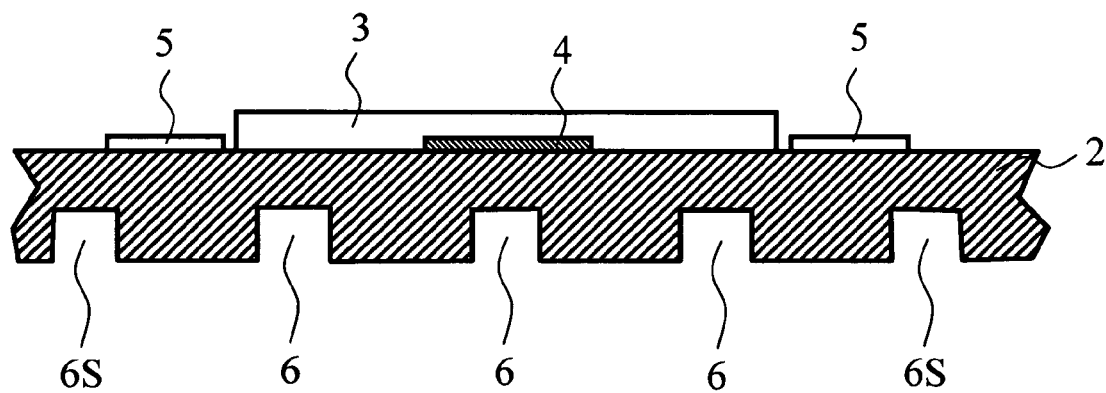

Subsequently, as shown in FIG. 13B, grooves 6, 6S having a depth of 75 μm, a kerf width of 100 μm and a pitch of 250 μm are formed on the underside of the GaAs substrate 2 in a grid-like arrangement. The grooves 6, 6S can be formed with a dicing saw. Alternatively, they may be formed by forming a mask (not shown) and then using wet or dry etching.

The grooves 6S are formed to agree with the boundary of adjacent semiconductor devices 1 on the wafer. Forming the grooves 6, 6S on the underside of the substrate 2 requires checking the boundary line (scribe line) of the semiconductor device 1 from the underside of the substrate 2 for positioning the grooves 6, 6S. There are various methods for this step. For example, an infrared microscope can be used to view through from the underside for checking the boundary line of the semiconductor device. Alternatively, a dichroic mirror can be used to check the pattern on the upside of the substrate 2 while forming the grooves 6, 6S on the underside. When these methods are used to check the boundary line of the semiconductor device 1, a metallic pattern along the boundary line formed on the surface of the substrate 2 is preferably used as a mark.

Figure 13C:
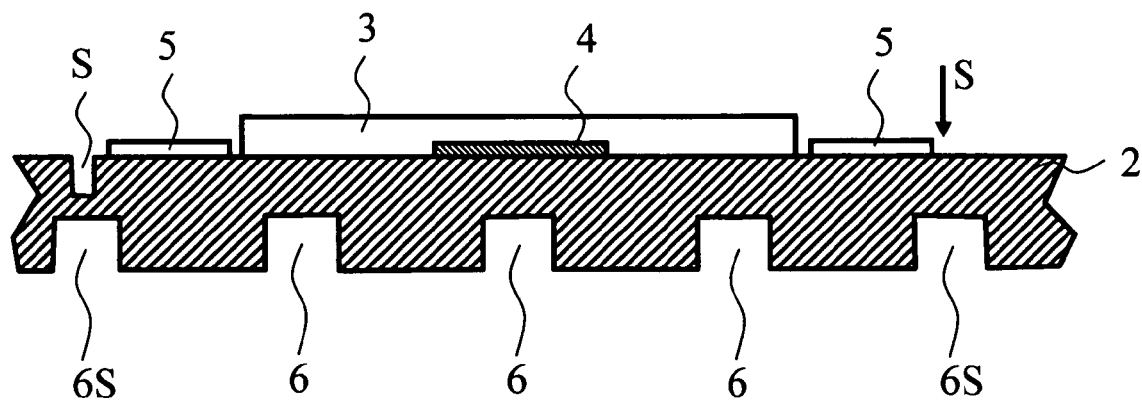

Next, as shown in FIG. 13C, a scribe line S is formed. More specifically, the semiconductor device 1 is cut along its boundary line with a dicing saw or the like from the upside of the substrate 2. Here, the scribe line S is preferably formed to agree with the center of the groove 6S. The scribe line S with a width narrower than that of the groove 6S can avoid "chipping" that may otherwise occur at the bottom edge of the groove 6S when the scribe line S is formed by dicing. In other words, the amount of GaAs chips during dicing can be reduced. For example, when the groove 6S has a width of 100 μm, the scribe line S preferably has a width on the order of 50 μm.

FIG. 13C shows a situation in the cutting process. Penetration of the scribe line S can cut the substrate 2. Another scribe line S is formed at a portion indicated by an arrow S in the figure to separate the semiconductor device 1.

Alternatively, the scribe line S may be allowed not to penetrate the substrate 2 to leave a slight portion of the thickness uncut. In this case, the uncut portion can be cleaved to separate the semiconductor device 1. This can often reduce chipping.

In addition, the scribe line S may be formed from the underside, rather than the upside, of the substrate 2.

Figure 13D:
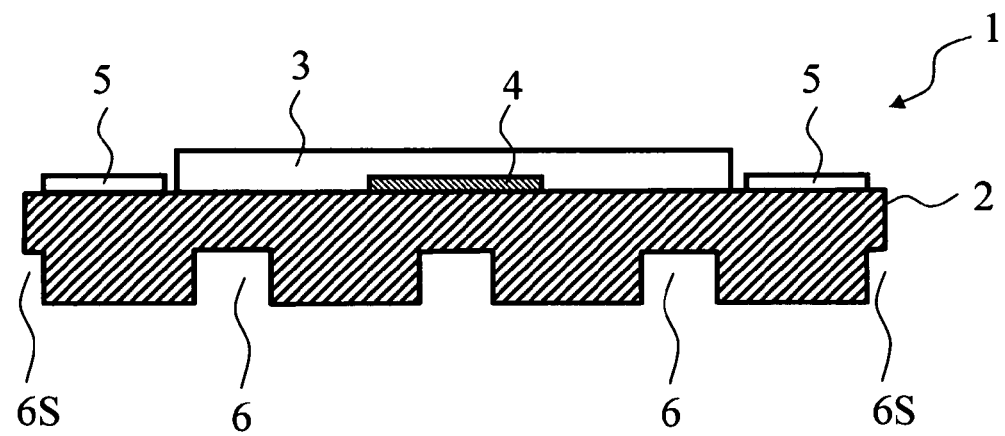

After the steps described above, the semiconductor device 1 is completed as shown in FIG. 13D.

The scribe line S with a width narrower than that of the groove 6S leaves a portion of the groove 6S at the edge of the semiconductor device 1. In other words, a recessed portion is formed on the side surface of the semiconductor device 1 near the underside. In this way, forming the groove 6S on the side surface of the semiconductor device 1 can further reduce the extent of squeezeout of adhesive 9 as described above with reference to FIG. 10.

FIGS. 14A through 14D are process cross-sectional views showing a method of manufacturing the semiconductor device 1 shown in FIGS. 2 and 11.

Figure 14A:
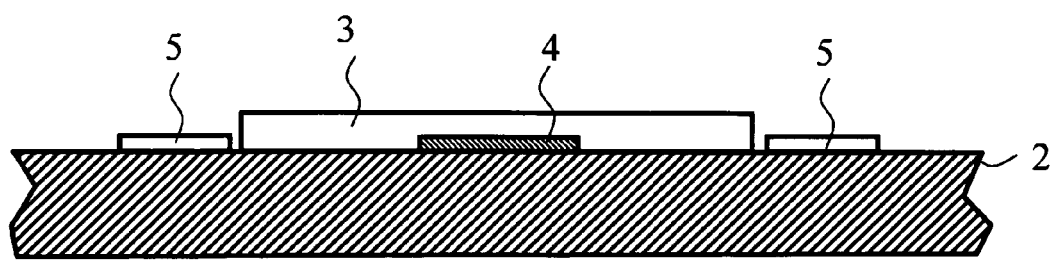
FIGS. 14A through 14D are process cross-sectional views showing a method of manufacturing the semiconductor device 1 shown in FIGS. 2 and 11.

First, as shown in FIG. 14A, a HBT device section 4, pads 5, and a protection film 3 are formed on the surface of a GaAs substrate 2.

Figure 14B:
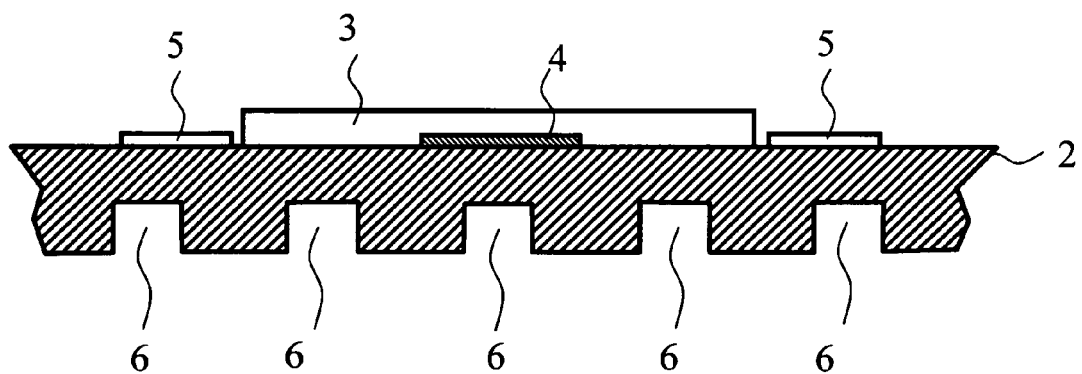

Next, as shown in FIG. 14B, grooves 6 are formed from the underside of the substrate 2 in a grid-like arrangement. This may be achieved by dicing, or by wet or dry etching. The grooves 6 can be formed with a depth of 75 µm, a kerf width of 50 µm and a predetermined pitch. It should be noted, however, that the pitch is appropriately determined so that the grooves 6 are not formed at the boundary of the semiconductor device 1.

Figure 14C:
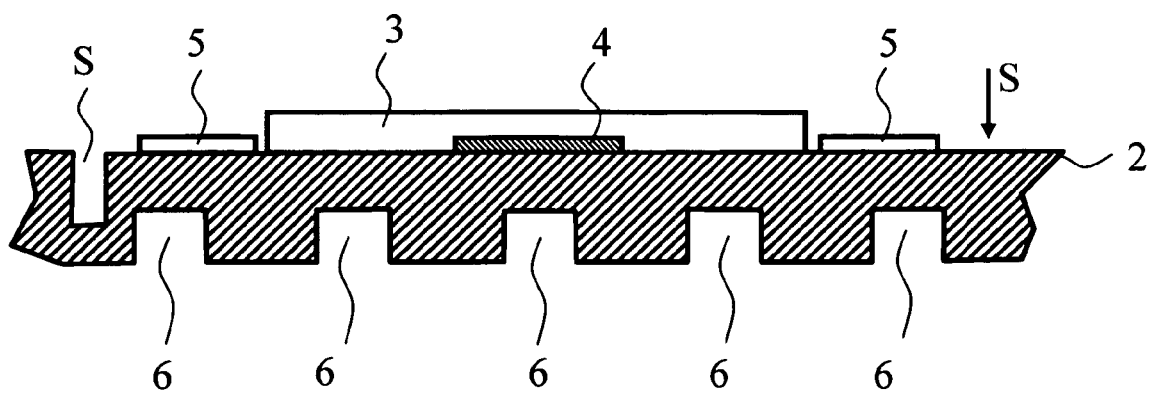

Then, as shown in FIG. 14C, a scribe line S is formed at the boundary of the semiconductor device 1 to cut the substrate 2. FIG. 14C shows a situation in the process of forming the scribe line S. Subsequent penetration of the scribe line S can cut the substrate 2. Alternatively, as described above with reference to FIG. 13C, the scribe line S may be allowed not to penetrate the substrate 2 to form an uncut portion, which is then cleaved.

Similarly, another scribe line S can be formed at a portion indicated by an arrow S to separate the semiconductor device 1. Also in this specific example, the scribe line S may be formed from the underside, rather than the upside, of the substrate 2.

Figure 14D:
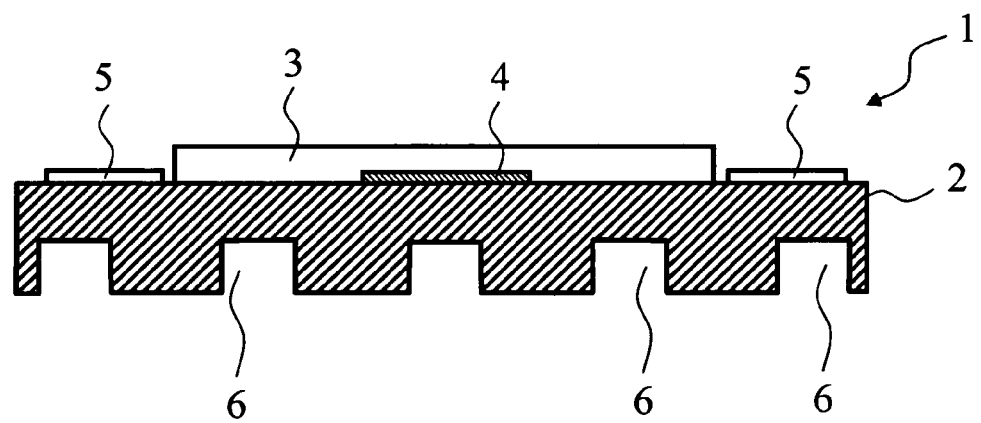

After the steps described above, the semiconductor device 1 is completed as shown in FIG. 14D.

FIGS. 15A through 15D are process cross-sectional views showing a method of manufacturing the semiconductor device 1 shown in FIGS. 3 and 12.

Figure 15A:
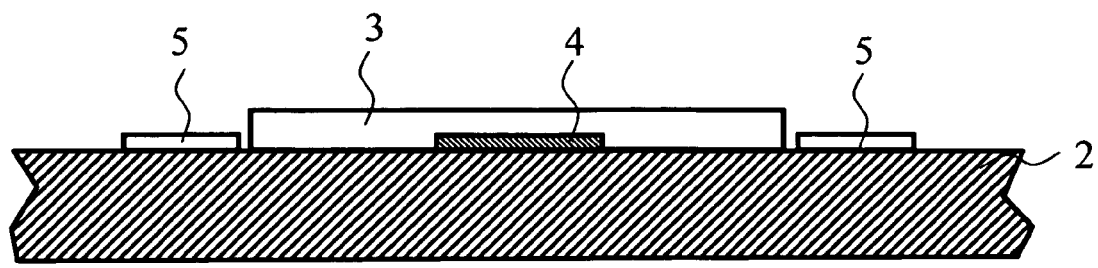
FIGS. 15A through 15D are process cross-sectional views showing a method of manufacturing the semiconductor device 1 shown in FIGS. 3 and 12.

First, as shown in FIG. 15A, a HBT device section 4, pads 5, and a protection film 3 are formed on the surface of a GaAs substrate 2.

Figure 15B:
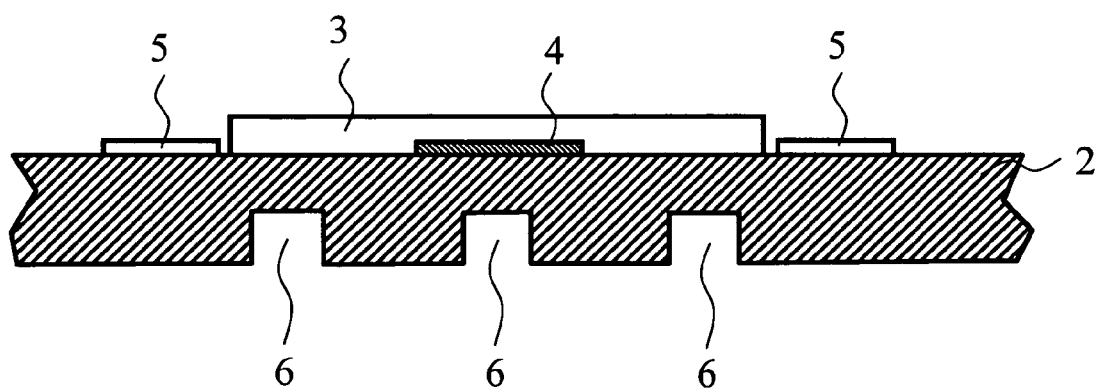

Next, as shown in FIG. 15B, grooves 6 are formed from the underside of the substrate 2 in a grid-like arrangement. This may be achieved by dicing, or by wet or dry etching. The grooves 6 can have a depth of 75 µm, a kerf width of 100 µm and a pitch of 175 µm. It should be noted that the groove 6 is not formed at the boundary of the semiconductor device 1.

Figure 15C:
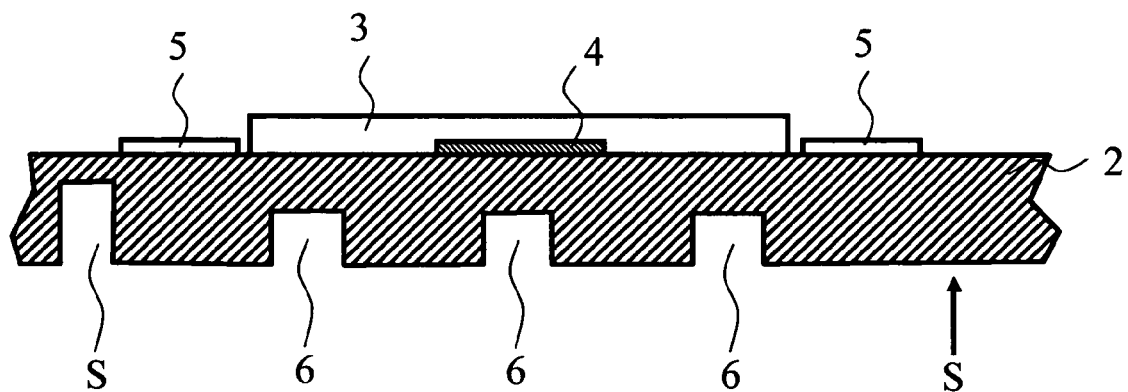

Then, as shown in FIG. 15C, a scribe line S is formed at the boundary of the semiconductor device 1 to cut the substrate 2. Here, the scribe line S is formed with the same pitch as that of the grooves 6. This eliminates the need for changing the index when both the grooves 6 and the scribe lines S are formed by dicing, for example, thus facilitating manufacture. FIG. 15C shows a situation in the process of forming the scribe line S. Subsequent penetration of the scribe line S can cut the substrate 2. Alternatively, as described above with reference to FIG. 13C, the scribe line S may be allowed not to penetrate the substrate 2 to form an uncut portion, which is then cleaved.

Similarly, another scribe line S can be formed at a portion indicated by an arrow S to separate the semiconductor device 1. Also in this specific example, the scribe line S may be formed from the upside, rather than the underside, of the substrate 2.

Figure 15D:
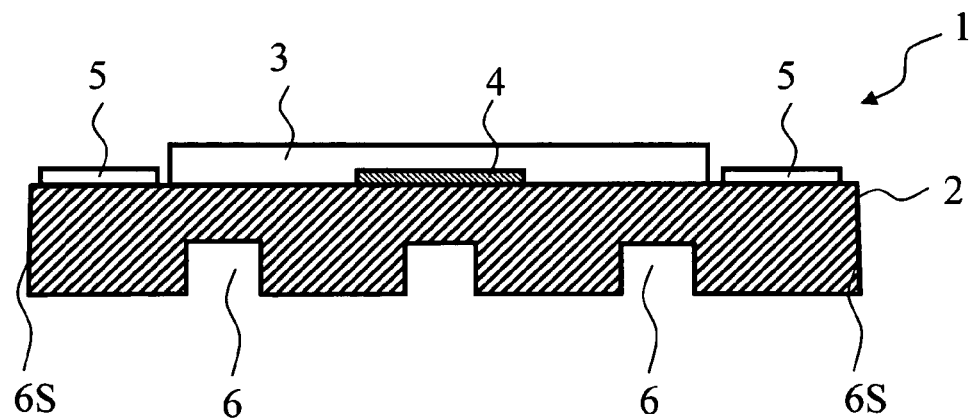

After the steps described above, the semiconductor device 1 is completed as shown in FIG. 15D.

Next, the heat dissipation of the semiconductor device 1 according to the present embodiment will be described.

As described above, when the semiconductor device 1 comprises a power device, a good heat dissipation is also required because an area of several millimeters square corresponds to a power consumption of several watts. For a power device having a large amount of self-heating, heat resistance is an important parameter that determines the performance or reliability of the semiconductor device.

When the semiconductor device 1 is in use, the HBT device section 4 formed on the GaAs substrate 2 generates heat. Much of the heat generated in the HBT device section 4 is absorbed into the underlying GaAs substrate 2. The heat is then passed through the GaAs substrate 2 and absorbed into the underlying mounting board 7. Therefore, a larger contact area between the GaAs substrate 2 and the mounting board 7 allows more heat to dissipate, which corresponds to a smaller heat resistance of the semiconductor device 1.

On the other hand, grid-like grooves 6 formed on the underside of the GaAs substrate 2 of the semiconductor device 1 according to the present embodiment reduce the bottom area of the GaAs substrate 2. More specifically, although forming the grid-like grooves 6 is effective at reducing the "squeezeout" of adhesive 9, it increases the heat resistance of the semiconductor device because the bottom area of the GaAs substrate 2 is decreased.

In addition, forming shallow grid-like grooves 6 may cause adhesive 9 to block a portion of the groove 6. This may form an enclosed space that is blocked with adhesive 9 at both ends in the groove 6. If such an enclosed space is formed, the pressure of gas sealed in the enclosed space increases during the manufacturing step, especially during the step of baking the adhesive 9 after the semiconductor device 1 is mounted, or when the gas is heated in the operation of the semiconductor device 1. This may detach the semiconductor device 1 from the mounting board 7.

On the other hand, forming deep grooves 6 may increase the heat resistance of the semiconductor device 1 or decrease the mechanical strength of the substrate 2. However, from the viewpoint of the strength of the substrate 2, it is considered sufficient that the portion where the groove 6 is formed has about half a thickness of the substrate 2. That is, a thickness of 50 to 100 µm is sufficient for the semiconductor device 1 used in mobile phones and other applications. In view of these considerations, the inventor investigated an optimum value for the width and depth of the grid-like groove 6.

Figure 16:
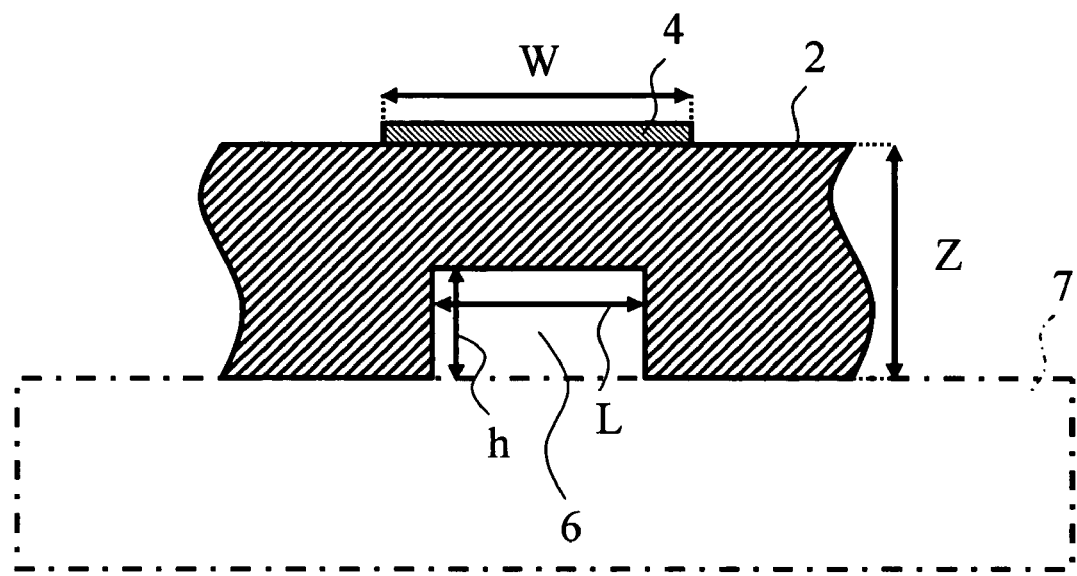
FIG. 16 is an enlarged cross-sectional view around a HBT device section of the semiconductor device according to the embodiment of the invention.

FIG. 16 is an enlarged cross-sectional view around a HBT device section of the semiconductor device according to the embodiment of the invention.

More specifically, a HBT device section 4 having an area of W×W mm$^2$ is formed on a GaAs substrate 2 having a thickness of Z mm. A groove 6 having a width of L mm and a depth of h mm is formed on the underside of the GaAs substrate 2. The inventor determined the effect that the area of the heat generating section (HBT device section 4) and the area of the groove 6 formed on the bottom surface of the underlying semiconductor substrate 2 exert on the heat resistance ratio of the semiconductor device.

Figure 17:
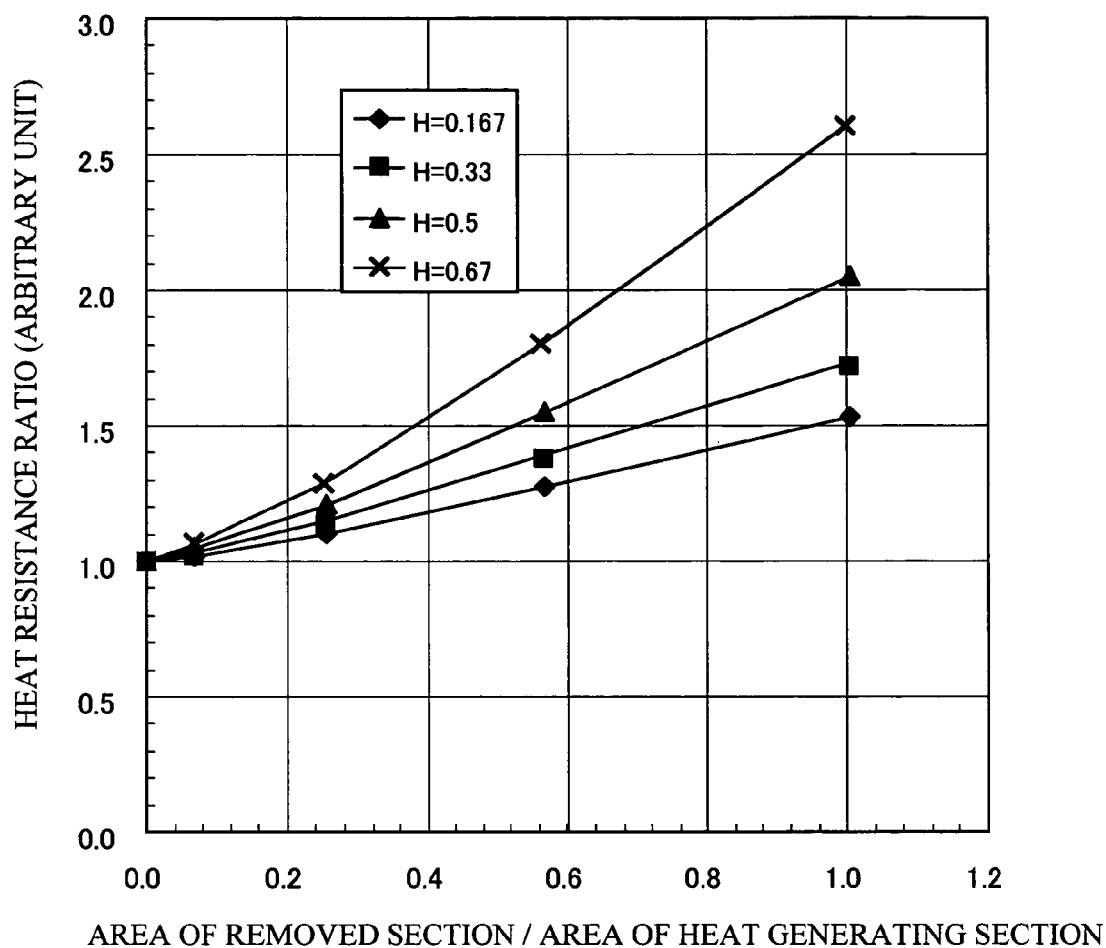
FIG. 17 is a graphical diagram showing the relation of the heat resistance ratio of the semiconductor device 1 versus the ratio of the area of the heat generating section (HBT device section 4) to the aperture area of the groove section.

FIG. 17 is a graphical diagram showing the relation of the heat resistance ratio of the semiconductor device 1 versus the ratio of the aperture area of the groove section to the area of the heat generating section (HBT device section 4).

Here, it is assumed that the heat generating section (HBT device section 4) has an area of W×W mm², the groove 6 has a aperture area of L×Lmm² and a depth of hmm, and the GaAs substrate 2 has a thickness of Z mm. The vertical axis of the graph in FIG. 17 represents the heat resistance ratio of the semiconductor device 1, and the horizontal axis represents a relative parameter R=aperture area of the groove (removed section)/area of the heat generating section=$(L/W)^2$. To represent the depth of the groove 6, a parameter H is defined as H=depth of the groove/thickness of the GaAs substrate=h/Z. The heat resistance ratio was calculated for four different values of H. The calculation was performed using the finite element method.

FIG. 17 reveals that the heat resistance ratio increases as the area of the groove 6 increases relative to the area of the heat generating section. For the parameter H, the heat resistance ratio increases as the depth of the groove 6 relatively increases.

Next, the inventor carried out a quantitative evaluation on the amount of squeezeout of adhesive in the semiconductor device according to the invention.

Figure 18A:
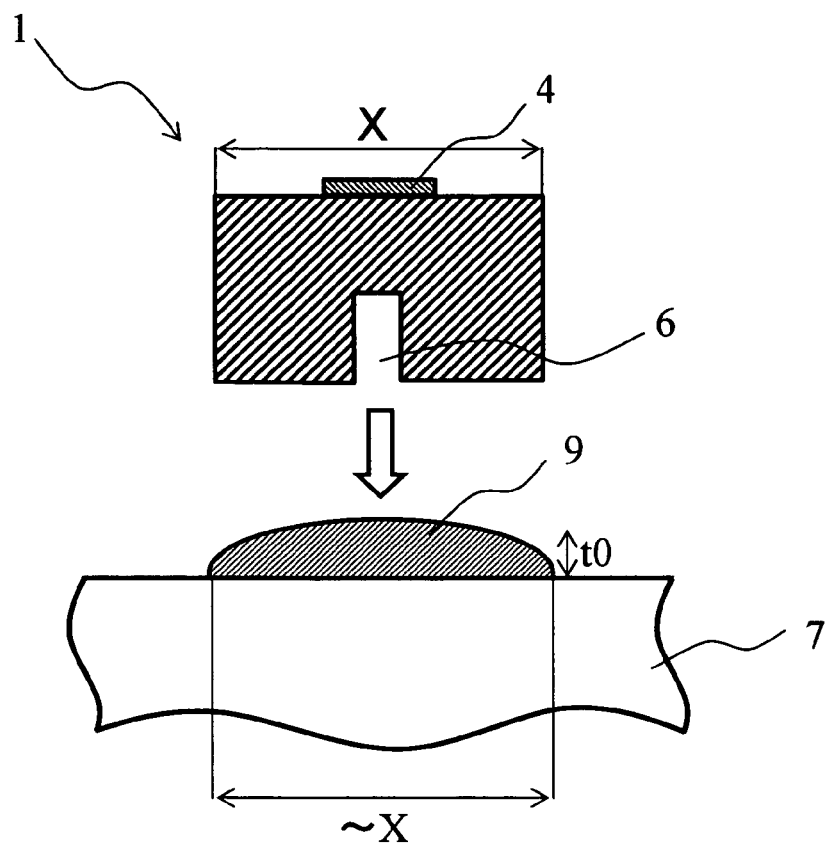
FIGS. 18A and 18B are schematic views showing a model of an evaluation performed by the inventor.
Figure 18B:
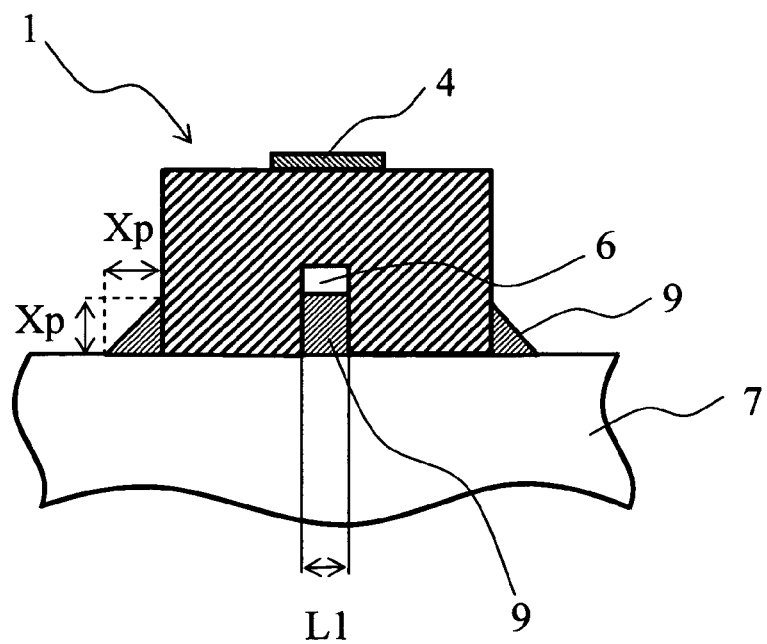

FIGS. 18A and 18B are schematic views showing a model of an evaluation performed by the inventor.

More specifically, as shown in FIG. 18A, adhesive 9 is dropped on the mounting board 7. Here, the dropped adhesive 9 has a planar size X that is substantially equal to the size X of the semiconductor device 1, and a thickness to.

In this situation, the volume $V_0$ of the adhesive 9 dropped on the surface of the mounting board 7 is given by the following expression:

$$V_0 = X \cdot X \cdot t_0$$

FIG. 18B shows a situation where the semiconductor device 1 is allowed to descend onto the adhesive 9 and fixed by pressure or of its own weight. Here, the extent to which the adhesive 9 is squeezed out around the semiconductor device 1 is denoted by Xp. The thickness of the adhesive 9 on the side surface of the semiconductor device 1 is also assumed to be Xp. That is, the squeezeout distance of the adhesive 9 is assumed to be equal to its wicking distance along the side surface of the semiconductor device 1.

First, suppose that n grooves 6 having a width of L1 are formed on the underside of the semiconductor device 1. Their total capacity (volume) $v_0$ can be expressed as follows:

$$v_0 = n \cdot L1 \cdot h \cdot X$$

Suppose that the inside of the groove 6 is substantially filled with adhesive 9 when the semiconductor device 1 is fixed. Then, the amount of adhesive 9 that is discharged around the device can be expressed as follows:

$$4X \cdot (X_p^2/2) = V_0 - v_0 = X^2 t_0 - nL1hX$$

With the help of the relative parameter R=aperture area of the groove (removed section)/area of the heat generating section and the depth parameter H=depth of the groove/thickness of the GaAs substrate=h/Z, the amount of squeeze out Xp of the adhesive 9 can be expressed as follows:

$$X_p = \sqrt{(Xt_0 - nZLH\sqrt{R})/2}$$

-continued $$X_p = X_{p0}\sqrt{1 - \frac{nZLH\sqrt{R}}{Xt_0}}$$

Here, $X_{p0}$ denotes the value of Xp when the relative parameter R=0.

Figure 19:
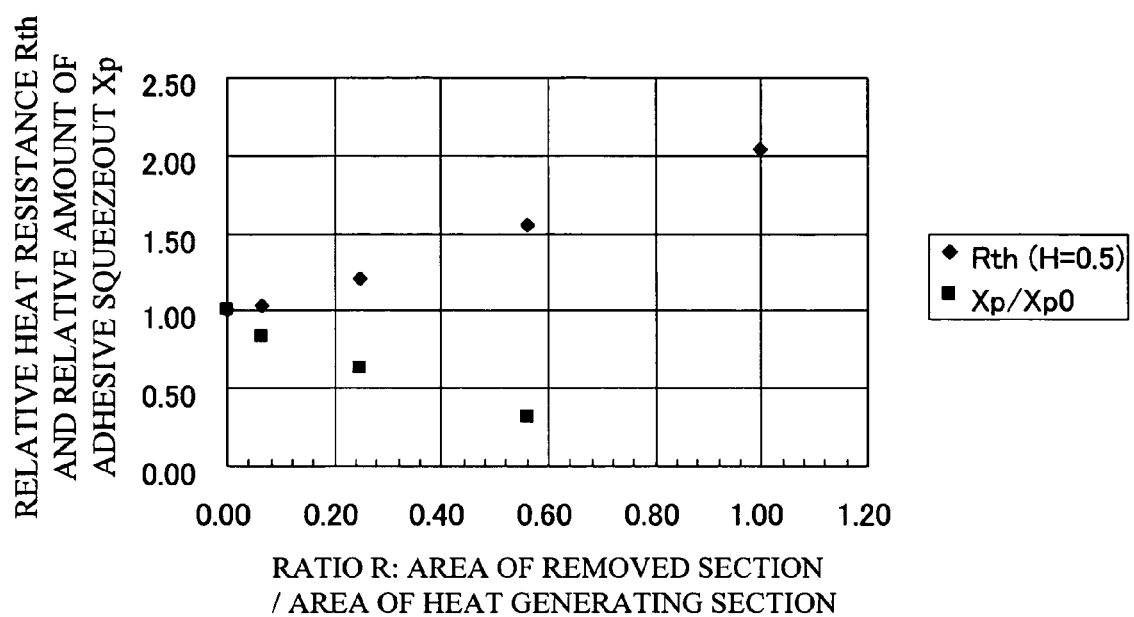
FIG. 19 is a graphical diagram illustrating the relation of a relative parameter R to the amount of squeezeout Xp of adhesive 9.

FIG. 19 is a graphical diagram illustrating the relation of a relative parameter R to the amount of squeezeout Xp of adhesive 9. The graph is illustrated for typical values where X=1 mm, $t_0$=0.1 mm, n=8, Z=150 μm, L=200 μm and H=0.5. This figure also shows the relation of the heat resistance ratio in the same condition.

FIG. 19 reveals that when the relative parameter R increases, the amount of squeezeout Xp of adhesive 9 decreases, whereas the heat resistance increases. However, these opposite effects are not equivalent to each other. For example, when the relative parameter R is set to about 0.1, the amount of squeezeout Xp can be decreased by nearly 20 percent, while the heat resistance only increases by at most about 5 percent.

From this point of view, the amount of squeeze out Xp can be effectively decreased while suppressing the increase of the heat resistance by setting the relative parameter R in a range between 0.1 and 0.25.

In this way, the invention can significantly reduce the amount of squeeze out of adhesive 9 while suppressing the increase of the heat resistance to a slight extent. As a result, the size of the semiconductor apparatus can be reduced, and its high-frequency characteristics can be improved through the reduction of the parasite capacitance and parasite inductance.

The inventor's prototype test revealed that a highly good result can be achieved, for example, for approximately H=0.5 and R=0.25. For example, the heat generating section (HBT device section 4) of the semiconductor device 1 can have an area of 0.16 mm², the face parallel to the mounting board 7 of the grid-like groove 6 formed on the underside of the GaAs substrate 2 can have an area of 0.0375 mm². In other words, the face parallel to the mounting board 7 of the grid-like groove 6 can have an area of about 25% of the area of the heat generating section. This can significantly reduce the amount of squeezeout of adhesive 9 while suppressing the substantial increase of the heat resistance. In addition, it is so easy to form equally spaced grooves 6 on the underside of the substrate 2 that this is also advantageous from the viewpoint of manufacture.

In the semiconductor device according to the present embodiment, the relation of the area of the heat generating section to the kerf width and the pitch of the groove always results in the bottom area of the GaAs substrate 2 under the heat generating section that is ¾ of the area of the heat generating section. This indicates that there is no need for the consideration of the positional relationship between the heat generating section and the groove section, which has a great advantage in simplifying design and manufacture processes.

Next, a semiconductor device is described that can obtain the advantage of the invention without increasing the heat resistance of the semiconductor device. While the heat resistance of the semiconductor device described above is set to an optimum value from various viewpoints, it is greater than that of conventional semiconductor devices.

A variation of the semiconductor device and the semiconductor apparatus according to the present embodiment will now be described.

Figure 20:
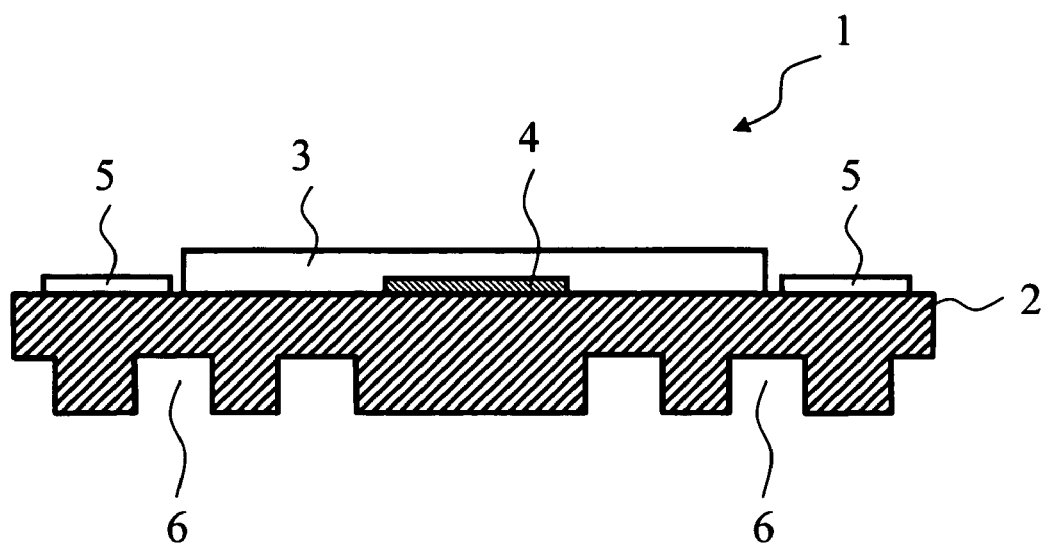
FIG. 20 is a schematic cross-sectional view showing a variation of the semiconductor device according to the embodiment of the invention.

FIG. 20 is a schematic cross-sectional view showing a variation of the semiconductor device according to the present embodiment.

Figure 21:
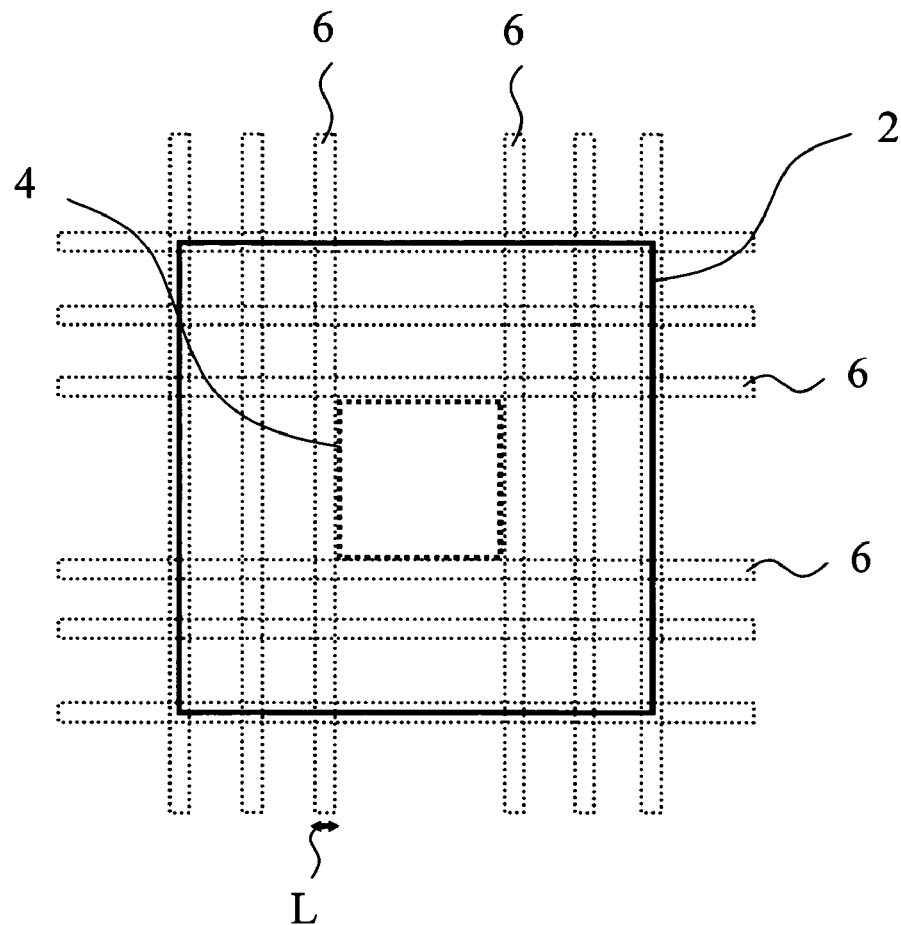
FIG. 21 is a schematic plan view illustrating the arrangement of grooves in the semiconductor device of the variation of the invention.

FIG. 21 is a schematic plan view illustrating the arrangement of grooves in the semiconductor device according to this variation.

In these figures, the same elements as those described with reference to FIGS. 1–19 are given the same reference numerals and not described in detail.

In this variation, the grooves 6 are not formed under the heat generating section (HBT device section 4). According to the inventor's investigation, any substantial increase in the heat resistance was not observed when the contact bottom area between the semiconductor device 1 and the mounting board 7 directly under the heat generating section is equal to the area of the heat generating section. In other words, any substantial increase in the heat resistance was not observed when the grooves 6 are not provided under the heat generating section. Therefore, this semiconductor device 1 can suppress the squeezeout of adhesive 9 without increasing the heat resistance. The depth and the width of the grid-like groove 6 can be set to, for example, 75 μm and 50 μm, respectively.

Figure 22:
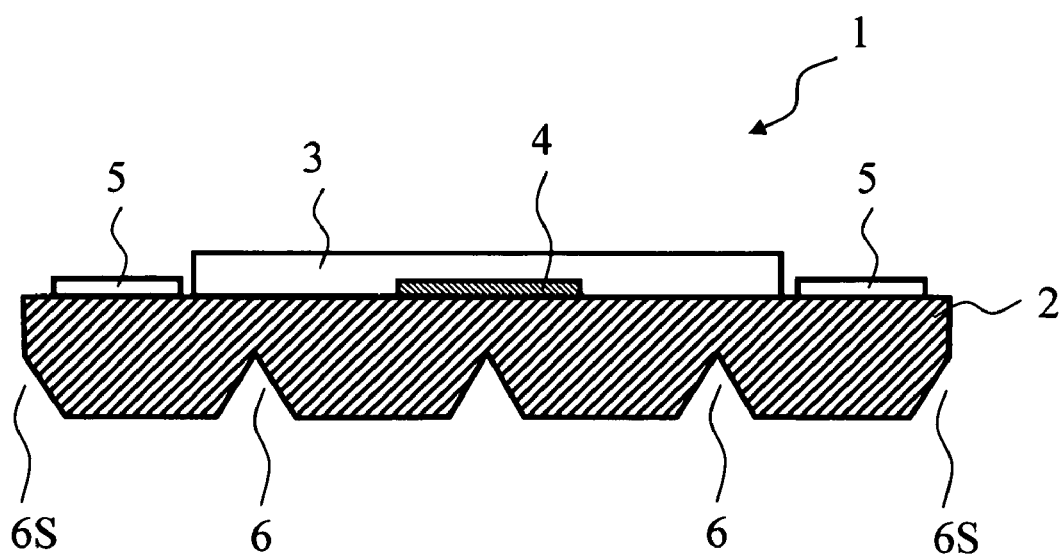
FIG. 22 is a schematic cross-sectional view showing another variation of the semiconductor device according to the embodiment of the invention.

FIG. 22 is a schematic cross-sectional view showing another variation of the semiconductor device according to the present embodiment.

In this variation, the grooves 6, 6S have a substantially triangular cross-sectional shape. More specifically, the groove 6 formed on the underside of the GaAs substrate 2 of the semiconductor device described above with reference to FIGS. 1–21 has a substantially rectangular cross-sectional shape. This can be formed by dicing with a dicing saw having an obtuse edge at the tip.

On the contrary, in this variation, a substantially triangular groove 6 can be formed by dicing with a dicing saw having an acute tip. The grooves 6 thus formed can also suppress the squeeze out of adhesive 9.

Also in this variation, the semiconductor device 1 can be separated by appropriately forming scribe lines S from the upside or underside of the substrate 2 as described above with reference to FIG. 13. The groove 6 on the underside of the substrate 2 can have an opening width of 100 μm, and a depth of 50 to 100 μm, for example.

The embodiment of the invention has been described with reference to specific examples. However, the invention is not limited to these specific examples.

For example, those skilled in the art can appropriately modify the design of material, conduction type, carrier concentration, impurities, thickness and relative arrangement, and particular techniques and conditions in each step of the method of manufacture, for each element of the semiconductor device and the semiconductor apparatus described above. Such modifications are also encompassed within the scope of the invention as long as they have any of the features of the invention.

What is claimed is:

1. A semiconductor device comprising:
   a bonding surface to be mounted with adhesive or solder on a mounting surface of a mounting member,
   one or more grooves being provided on the bonding surface, the grooves extending in a direction substantially parallel to one side surface of the semiconductor device,
   wherein the semiconductor device has a heat generating section, and the one or more grooves are not substantially formed under the heat generation section.

2. A semiconductor device comprising:
   a bonding surface to be mounted with adhesive or solder on a mounting surface of a mounting member,
   one or more grooves being provided on the bonding surface, the grooves extending in a direction substantially parallel to one side surface of the semiconductor device,
   wherein the semiconductor device has a heat generating section, and a relative ratio of an aperture area of the grooves to an area of the heat generating section is in a range between 0.1 and 0.25.

3. A semiconductor apparatus comprising:
   a mounting member having a mounting surface; and
   a semiconductor device mounted with adhesive or solder on the mounting surface, one or more grooves being provided on a bonding surface of the semiconductor device, the grooves extending in a direction substantially parallel to one side surface of the semiconductor, wherein:
   the mounting member has a first electrode pad;
   the semiconductor device has a second electrode pad; and
   the first electrode pad and the second electrode pad is connected with a conductive member.

4. The semiconductor apparatus according claim 3, wherein at least a part of the grooves is filled with the adhesive or solder.

5. The semiconductor apparatus according to claim 3, wherein the one or more grooves are provided on the bonding surface in a grid-like arrangement.

6. The semiconductor apparatus according to claim 3, wherein at least one of the one or more grooves is provided at one or more edges of the bonding surface.

7. The semiconductor apparatus according to claim 3, wherein the semiconductor device has a heat generating section, and the one or more grooves are not substantially formed under the heat generating section.

8. The semiconductor apparatus according to claim 3, wherein a second side of the semiconductor device, which is perpendicular to the directions, has a size that is an integral multiple of a pitch of an arrangement of the grooves.

9. The semiconductor apparatus according to claim 3, wherein a cross section of the grooves is substantially quadrangular.

10. The semiconductor apparatus according to claim 3, wherein a cross section of the grooves is substantially triangular.

11. The semiconductor apparatus according to claim 3, wherein a depth of the grooves is substantially half of a thickness of the semiconductor device.

12. The semiconductor apparatus according to claim 3, wherein the semiconductor device has a heat generating section, and a relative ratio of an aperture area of the grooves to an area of the heat generating section is in a range between 0.1 and 0.25.

13. The semiconductor apparatus according to claim 3, wherein the conductive member is a wire.

14. The semiconductor apparatus according to claim 3, wherein the one of more grooves has an opening in a second side of the semiconductor device, the second side being perpendicular to the direction.

15. The semiconductor apparatus according to claim 3, wherein at least one of the one or more grooves is partially filled with the adhesive and has a part where the adhesive is not filled therein.

* * * * *